(12) United States Patent
Shiramizu et al.

(10) Patent No.: US 9,361,978 B2
(45) Date of Patent: Jun. 7, 2016

(54) SERIES CONNECTED RESISTANCE CHANGE MEMORY DEVICE

(71) Applicant: Hitachi, Ltd., Chiyoda-ku, Tokyo (JP)

(72) Inventors: Nobuhiro Shiramizu, Tokyo (JP); Satoru Hanzawa, Tokyo (JP); Akira Kotabe, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 14/421,822

(22) PCT Filed: Sep. 20, 2012

(86) PCT No.: PCT/JP2012/074080
§ 371 (c)(1),
(2) Date: Feb. 14, 2015

(87) PCT Pub. No.: WO2014/045372
PCT Pub. Date: Mar. 27, 2014

(65) Prior Publication Data
US 2015/0221367 A1    Aug. 6, 2015

(51) Int. Cl.
*G11C 13/00* (2006.01)
*H01L 27/24* (2006.01)
*H01L 45/00* (2006.01)

(52) U.S. Cl.
CPC .......... *G11C 13/0061* (2013.01); *G11C 13/003* (2013.01); *G11C 13/0004* (2013.01); *H01L 27/249* (2013.01); *H01L 27/2454* (2013.01); *G11C 2013/0071* (2013.01); *G11C 2213/71* (2013.01); *G11C 2213/75* (2013.01); *G11C 2213/79* (2013.01); *H01L 45/06* (2013.01); *H01L 45/1233* (2013.01); *H01L 45/144* (2013.01)

(58) Field of Classification Search
CPC ............ G11C 13/0004; G11C 13/003; G11C 13/0061; G11C 2013/0071; G11C 2213/71; G11C 2213/75; G11C 2213/79; H01L 27/2454; H01L 27/249; H01L 45/06; H01L 45/1233; H01L 45/144
See application file for complete search history.

(56) References Cited

U.S. PATENT DOCUMENTS

| | | | |
|---|---|---|---|
| 7,961,500 B2* | 6/2011 | Shinozaki | G11C 11/413 365/154 |
| 8,238,161 B2* | 8/2012 | Park | G11C 16/0483 365/185.02 |
| 2004/0174732 A1 | 9/2004 | Morimoto | |
| 2009/0168505 A1 | 7/2009 | Hanzawa et al. | |

(Continued)

FOREIGN PATENT DOCUMENTS

| | | |
|---|---|---|
| JP | 2004-272975 A | 9/2004 |
| JP | 2009-158020 A | 7/2009 |
| JP | 2011-114016 A | 6/2011 |

(Continued)

*Primary Examiner* — Harry W Byrne
*Assistant Examiner* — Lance Reidlinger
(74) *Attorney, Agent, or Firm* — Miles & Stockbridge P.C.

(57) ABSTRACT

The invention is provided to suppress a current supplied to a storage element so as not to vary for each layer in a semiconductor memory device obtained by connecting a plurality of memory cells in series.
A semiconductor memory device according to the invention includes a plurality of memory cells connected in series between a first signal line and a second signal line, and supplies a different gate voltage to at least two of selection transistors included in the memory cells, respectively (refer to FIG. 2).

19 Claims, 15 Drawing Sheets

(56) References Cited

U.S. PATENT DOCUMENTS

2011/0122676 A1    5/2011    Murooka et al.
2012/0248399 A1    10/2012    Sasago et al.

FOREIGN PATENT DOCUMENTS

| | | |
|---|---|---|
| JP | 2012-074542 A | 4/2012 |
| WO | WO 2011/074545 A1 | 6/2011 |

\* cited by examiner (a)

(b)

SERIES CONNECTED RESISTANCE CHANGE MEMORY DEVICE

TECHNICAL FIELD

The present invention relates to a semiconductor memory device.

BACKGROUND ART

In recent years, as a memory to replace a flash memory that is approaching a limit of miniaturization, a resistance variable memory has been studied. As one example of the resistance change type storage element, a phase-change memory which uses chalcogenide (phase-change material) such as $Ge_2Sb_2Te_5$ has been extensively studied.

A state of the phase-change material is changed to an amorphous state or a crystalline state by Joule heat generated by an applied current. A material in the amorphous state has a high resistance value, and a material in a crystalline state has a low resistance value. It is possible to exhibit a function as a storage element by correlating a change in the resistance value with information.

In an information rewriting operation for the phase-change memory, an applied current is controlled according to information to be written. In a reset operation, that is, an operation of writing a bit "0", a large amount of current is caused to flow for a short period of time to dissolve the phase-change material, and then a current is suddenly reduced. Accordingly, the phase-change material is rapidly cooled down, and the phase-change material is changed to the amorphous state of high resistance. On the other hand, a set operation, that is, an operation of writing a bit "1", allows a sufficient current to flow for a long period of time so as to hold the phase-change material in a crystalline state. The phase-change material is changed to the crystalline state of low resistance. In an operation of reading information, a constant potential difference is given to both ends of the storage element and a current flowing in the element is measured, and thereby a resistance value of the element is determined.

In the phase-change material, when a shape of the storage element becomes small, a current necessary for changing a state of the phase-change material is reduced. Therefore, in principle, miniaturization and multi-layerization are pursued to achieve high integration.

In PTLs 1 and 2 to be described below, as a method for high integration of the phase-change memory in addition to miniaturization, a technology related to multi-layerization is described. In PTL 1, a structure in which memory cells configured to have a recording layer made of a chalcogenide material and a cell selection diode are stacked through an insulation layer is described. In PTL 2, a technology of stacking a plurality of memory cells made of a cell selection transistor and a recording element in a height direction by forming a through hole in a stack body obtained by stacking a plurality of gate electrodes and gate insulation layers and forming a gate insulation film, a silicon layer to be a channel, and a chalcogenide layer to be a recoding layer on a side surface of the through hole is described. It is possible to increase area density of a memory cell and to achieve high integration by increasing the number of stacked memory cells in the height direction.

CITATION LIST

Patent Literature

PTL 1: JP-A-2009-158020
PTL 2: WO2011-074545

SUMMARY OF INVENTION

Technical Problem

In PTL 1, as described in a circuit diagram shown in FIG. 3 and a cross-sectional view shown in FIG. 4 of the document, only one memory cell is connected between a word line and a bit line, which is a path of a write current or a read current in a normal direction with respect to a substrate. In PTL 1, memory cells are multi-layered by stacking a layer structure including a word line/a memory cell/a bit line.

On the other hand, in order to connect the word line, the bit line, and a peripheral circuit in PTL 1, it is necessary to dispose contact wiring which connects different layers separately from a region in which the storage element is disposed. When the number of stacks is increased, a region for disposing the contact wiring is also increased accordingly. Furthermore, in order to reduce a voltage drop due to the write current, it is necessary to reduce a parasitic resistance by ensuring an area of a region where the contact wiring is disposed. Therefore, since a wiring region is increased as the number of stacks is increased, it is considered that an increase in the area density of the storage element is not sufficient.

In PTL 2, as described in a cross-sectional view shown in FIG. 4 and a circuit diagram shown in FIG. 5, since a plurality of memory cells are stacked between the word line and the bit line, the number of word lines and bit lines is not increased even though the number of stacks of the memory cell is increased.

In addition, since a gate wiring which controls the memory cell is not a current path for reading information, an influence of the voltage drop due to a parasitic resistance is small. Accordingly, since a plurality of memory cells can be controlled by one gate wiring, a region in which the gate wiring is disposed is reduced, and an increase in an area of a peripheral circuit is small even though the number of stacks of the memory cell is increased. Therefore, it is possible to significantly increase the area density of the storage element.

In a technology described in PTL 2, since a current flowing between a word line and a bit line through a selection transistor of the memory cell receives an influence of ON resistance of the selection transistor and causes a voltage drop, a source potential of the selection transistor is different for each layer. As a result, when it is assumed that a gate voltage of the memory cell is constant regardless of layer, a gate-source voltage is different for each layer. Accordingly, a current for reading and writing information from and to the memory cell varies for each layer.

When characteristics of the storage element vary, there is a risk of generating a write error or a read error. Accordingly, it is necessary to ensure a margin in consideration of a variation with respect to a normal operation range. This leads to an increase in an operation voltage of a semiconductor storage element, and thereby the technology is not desirable from a viewpoint of power saving.

The present invention is made in view of the problems described above, and is provided to suppress a current supplied to a storage element so as not to vary for each layer in a semiconductor memory device in which a plurality of memory cells are connected in series.

Solution to Problem

A semiconductor memory device according to the invention includes a plurality of memory cells connected in series between a first signal line and a second signal line, and supplies a different gate voltage to at least two of selection transistors included in the memory cells, respectively.

Advantageous Effects of Invention

In the semiconductor memory device according to the invention, it is possible to suppress a variation in a current for each layer, which is supplied to a storage element.

Objects, configurations, and effects in addition to those described above will be apparent by description of following embodiments.

DESCRIPTION OF EMBODIMENTS

Hereinafter, an embodiment of the present invention will be described in detail based on drawings. In all drawings for describing an embodiment, the same sign is given to a member having the same function to omit repeated description thereof. In addition, it is noted in advance that a description of a characteristic configuration is not limited to each embodiment, and the same effects can be obtained when taking a common configuration. Moreover, a circuit element which configures each memory cell of an embodiment, when not particularly limited, is formed on a semiconductor substrate like single crystal silicon by an integrated circuit technology such as a known complementary MOS transistor (CMOS) and the like.

Embodiment 1

Figure 1:
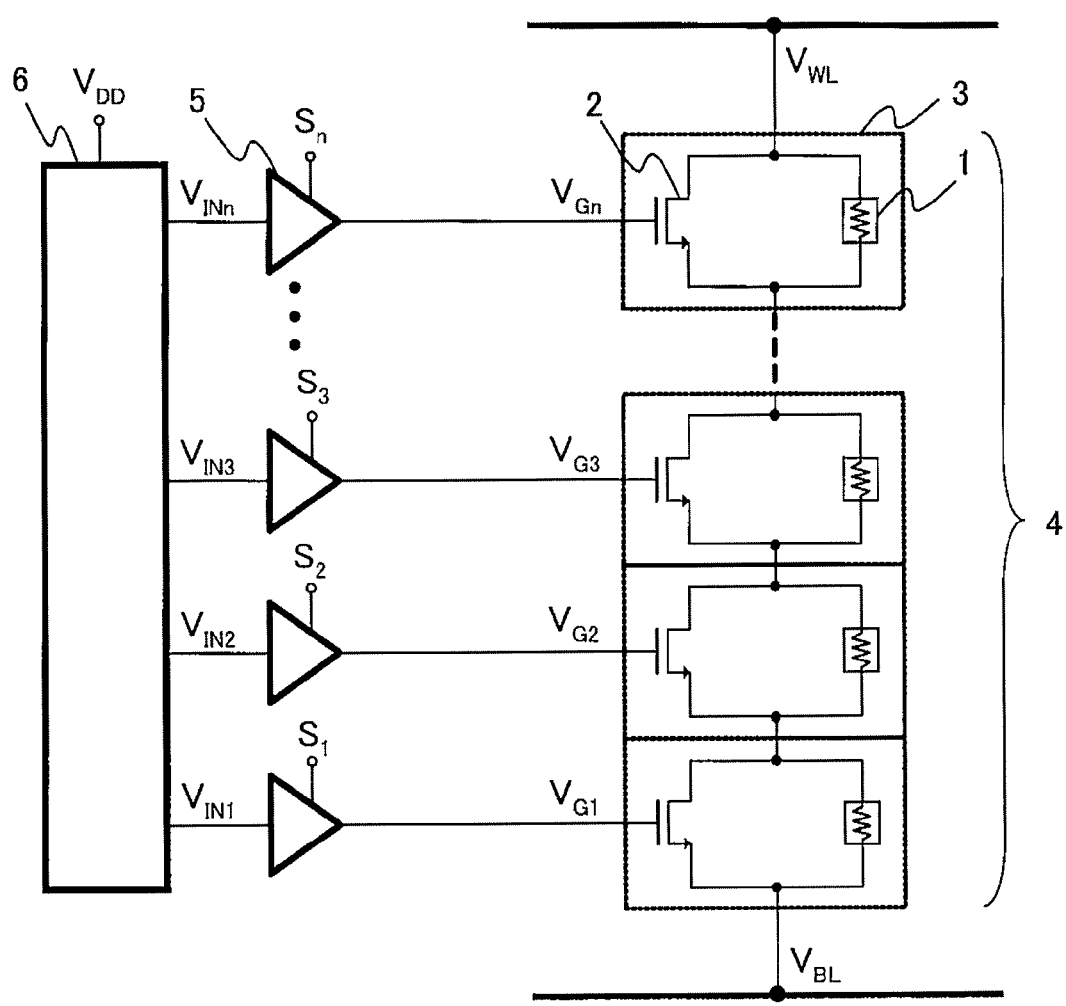
FIG. 1 is a diagram which shows a memory circuit configuration of a semiconductor memory device according to Embodiment 1.

FIG. 1 is a diagram which shows a memory circuit configuration of a semiconductor memory device according to Embodiment 1 of the present invention. A memory cell 3 has a configuration in which a phase-change type storage element 1 and a selection transistor 2 are connected in parallel, and both terminals of the storage element 1 are connected to a drain and a source of the selection transistor 2. A memory cell group 4 has a configuration in which a plurality of memory cells 3 are connected in series between a word line (a signal line having a potential $V_{WL}$) and a bit line (a signal line having a potential $V_{BL}$). A selection gate driver 5 is provided to correspond to the memory cell 3 of each layer, respectively, and receives a supply of an input voltage VIN from a voltage converter 6 to drive the selection transistor 2 of each memory cell 3. The memory cell group 4 is stacked on a semiconductor substrate of a semiconductor memory device in a normal direction to be formed. Accordingly, it is possible to increase the number of memory bits per area compared to a semiconductor memory device of the related art.

Even if not shown in FIG. 1, a plurality of memory cell groups 4 are formed on a semiconductor substrate. A potential difference between the potential $V_{WL}$ of a word line and the potential $V_{BL}$ of a bit line occurs, and thereby one memory cell group 4 is selected. Furthermore, a potential of one of control terminals $S_1$ to $S_n$ of the selection gate driver 5 is changed, and thereby only a selection transistor 2 corresponding to the layer is cut off, and a current flows in the storage element 1, not in the selection transistor 2 in the layer. Accordingly, it is possible to selectively write, erase, and read information with respect to one memory cell.

Figure 2:
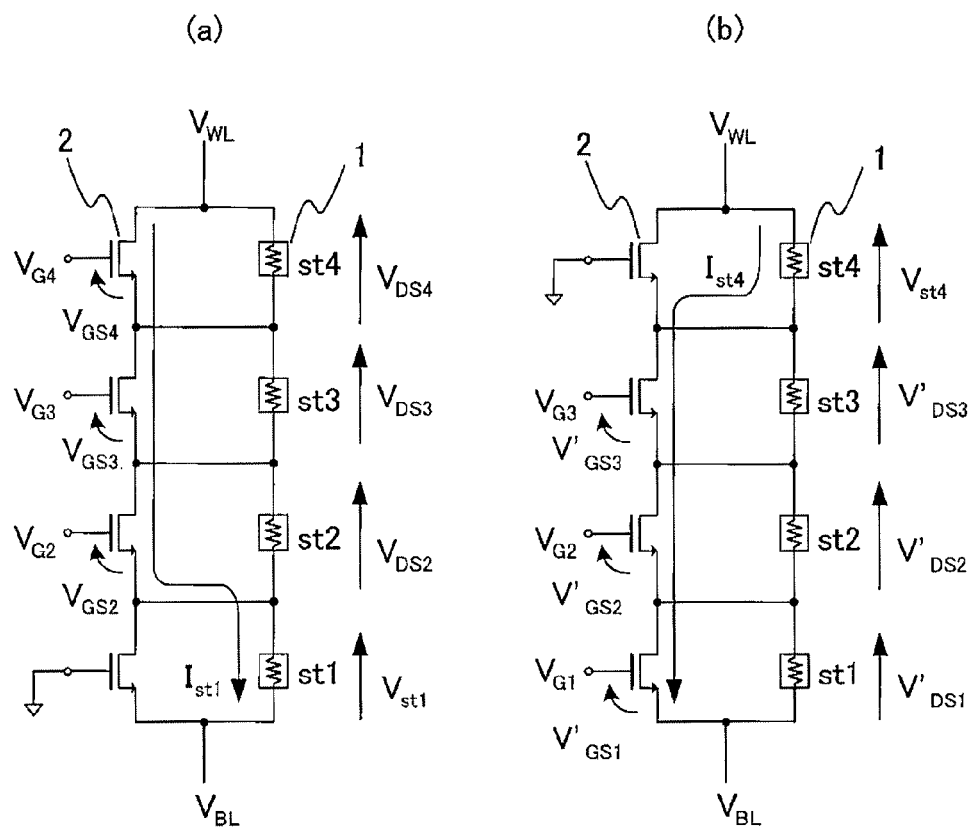
FIG. 2 is a diagram which shows an operation principle when a memory cell group 4 is configured to have a four-layered memory cell 3.

FIG. 2 is a diagram which shows an operation principle when the memory cell group 4 is configured to have the four-layered memory cell 3. FIG. 2(a) shows a state in which a memory cell of a storage element st1 is selected, and FIG. 2(b) shows a state in which a memory cell of a storage element st4 is selected. The word line potential $V_{WL}$ is larger than the bit line potential $V_{BL}$, and thereby a specific memory cell group 4 is selected.

In a case of FIG. 2(a), a path in which a current flows is formed in the storage element st1 by turning off a selection transistor of a memory cell having the storage element st1. Each selection transistor is turned on by applying voltages $V_{G2}$, $V_{G3}$, and $V_{G4}$ to gate terminals of selection transistors of another memory cell, respectively, so as to cause a current not to flow in the storage elements st2 to st4. Similarly, in a case of FIG. 2(b), a selection transistor of a memory cell corresponding to the storage element st4 is turned off, and voltages $V_{G1}$, $V_{G2}$, and $V_{G3}$ are applied to gate terminals of selection transistors of another memory cell. By such an operation, currents $I_{st1}$ and $I_{st4}$ flow in each storage element, such that it is possible to selectively write or read information on a memory cell.

When a large amount of current flows in the storage element for a short period of time, the storage element has a high resistance, and is erased (reset) in a state of bit '0', and when a small amount of current flows in the storage element for a long period of time, the storage element has a low resistance, and is written (set) in a state of bit '1'. When reading a state of the storage element, a potential difference smaller than when performing an erase or a write is applied between a word line and a bit line, and a difference in a resistance value of the storage element due to a difference in a current value is detected, thereby reproducing a bit value.

Since each selection transistor has an ON resistance, a voltage drop occurs when a current Ist1 or Ist4 flows. Therefore, a source potential of each transistor is different for each layer. Accordingly, when the gate potentials $V_{G1}$ to $V_{G4}$ supplied to selection transistors of each layer are all the same values, a gate-source voltage $V_{GS}$ of each layer is different for each layer. Specifically, $V_{GS4}$ is the highest, the gate-source voltage is gradually lowered as it becomes closer to a bit line, and $V_{GS1}$ is the lowest. Since ON resistance of the selection transistor is based on $V_{GS}$, the ON resistance varies for each layer and as a result, a current flowing in the storage element of each layer is different for each layer. Thus, a write error or a read error is more likely to occur.

The voltage converter 6 and the selection gate driver 5 supply a different gate potential to each memory cell, the gate-source voltage $V_{GS}$ of each selection transistor is the same for each selection transistor, and a current flowing in each storage element is made to be the same for each layer. Specifically, the voltage converter 6 generates voltages $V_{IN1}$ to $V_{INn}$ corresponding to each layer based on an input voltage $V_{DD}$, and supplies the generated voltages to the selection gate driver 5 corresponding to each layer, respectively. The selection gate driver 5 receives a logic signal indicating a selection or a non-selection of a memory cell from control terminals S1 to Sn, respectively, and supplies a gate potential $V_G$ to the selection transistor for each layer according to the received logic signal. When a memory cell is selected, the gate potential is set to be a ground potential, and when the memory cell is not selected, an input voltage $V_{IN}$ is supplied as a gate potential.

Embodiment 1

Summary

As described above, the semiconductor memory device according to Embodiment 1 can reduce a variation in a current flowing in the storage element for each layer by supplying a different gate voltage to selection transistors of memory cells of each layer, respectively.

Embodiment 2

Figure 3:
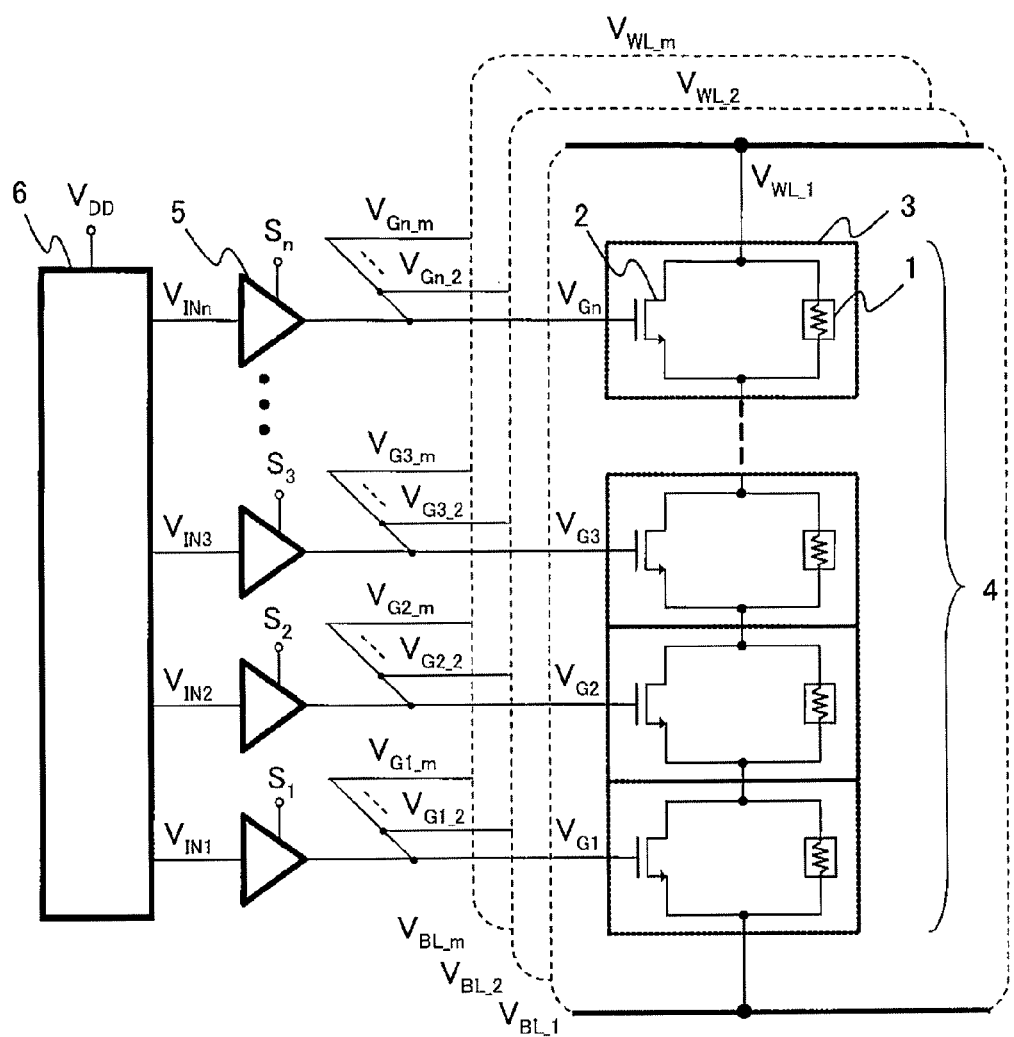
FIG. 3 is a diagram which shows a memory circuit configuration of a semiconductor memory device according to Embodiment 2.

FIG. 3 is a diagram which shows a memory circuit configuration of a semiconductor memory device according to Embodiment 2 of the invention. In Embodiment 2, m memory cell groups 4 are provided. In FIG. 3, for convenience of description, a circuit configuration including a word line, a memory cell group 4, and a bit line is surrounded by a dotted line to distinguish each memory cell group 4.

Each memory cell group 4 can be selected by selectively causing a predetermined potential difference to occur between a word line and a bit line. For example, a word line is extended in an X direction on a substrate, and a bit line is extended in a Y direction on the substrate, and it is possible to select the memory cell group 4 disposed at a position at which the word line and the bit line intersect with each other. Alternatively, the same effects can be exhibited by providing a selection switch between one signal line and the memory cell group 4.

In Embodiment 2, selection transistors disposed on the same layer among selection transistors included in each memory cell group 4 are connected to the selection gate driver 5 corresponding to the layer in parallel. That is, each selection gate driver 5 supplies a common gate voltage to the selection transistors disposed on the same layer. Accordingly, since it is possible to suppress a circuit occupying area and power consumption of the voltage converter 6 and the selection gate driver 5 to be small, an area density of a memory cell is improved.

Embodiment 3

Figure 4:
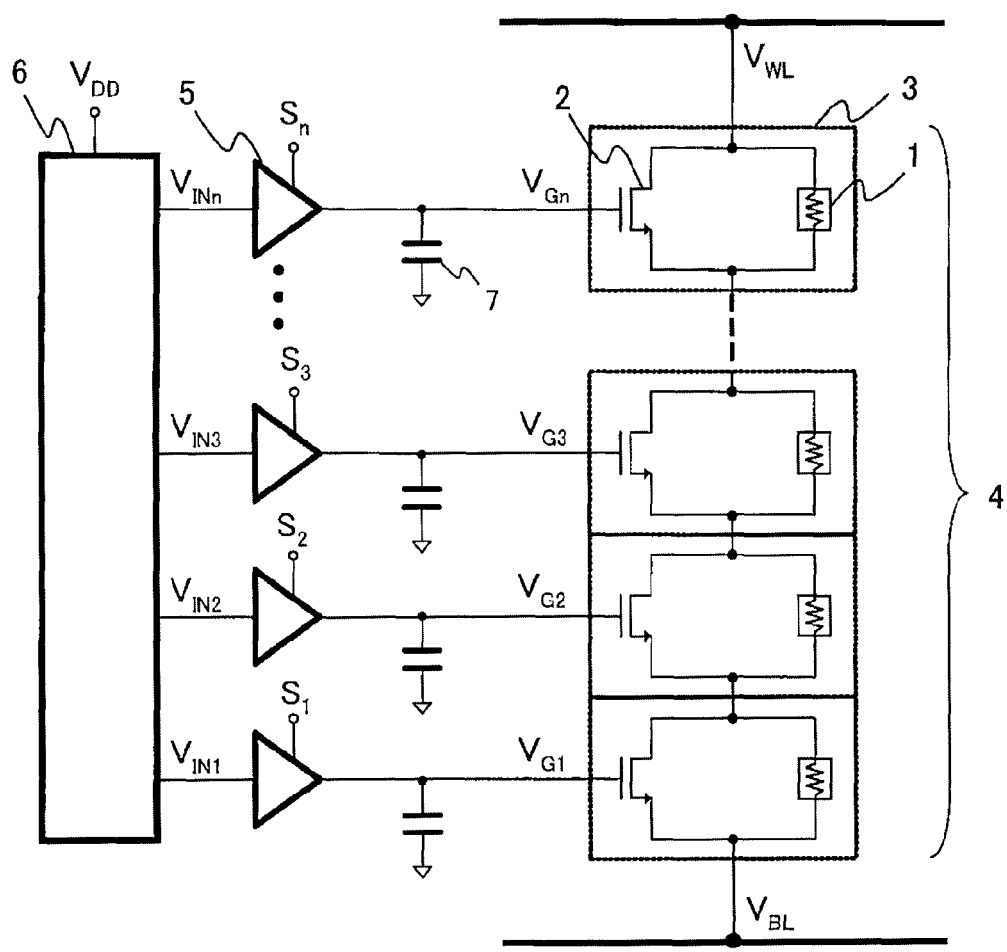
FIG. 4 is a diagram which shows a memory circuit configuration of a semiconductor memory device according to Embodiment 3.

FIG. 4 is a diagram which shows a memory circuit configuration of a semiconductor memory device according to Embodiment 3 of the invention. In Embodiment 3, a delay circuit configured to have the capacitor 7 is provided in parallel with respect to a signal line which connects each selection gate driver 5 and a corresponding selection transistor. The other configurations are the same as in Embodiment 1.

Figure 5:
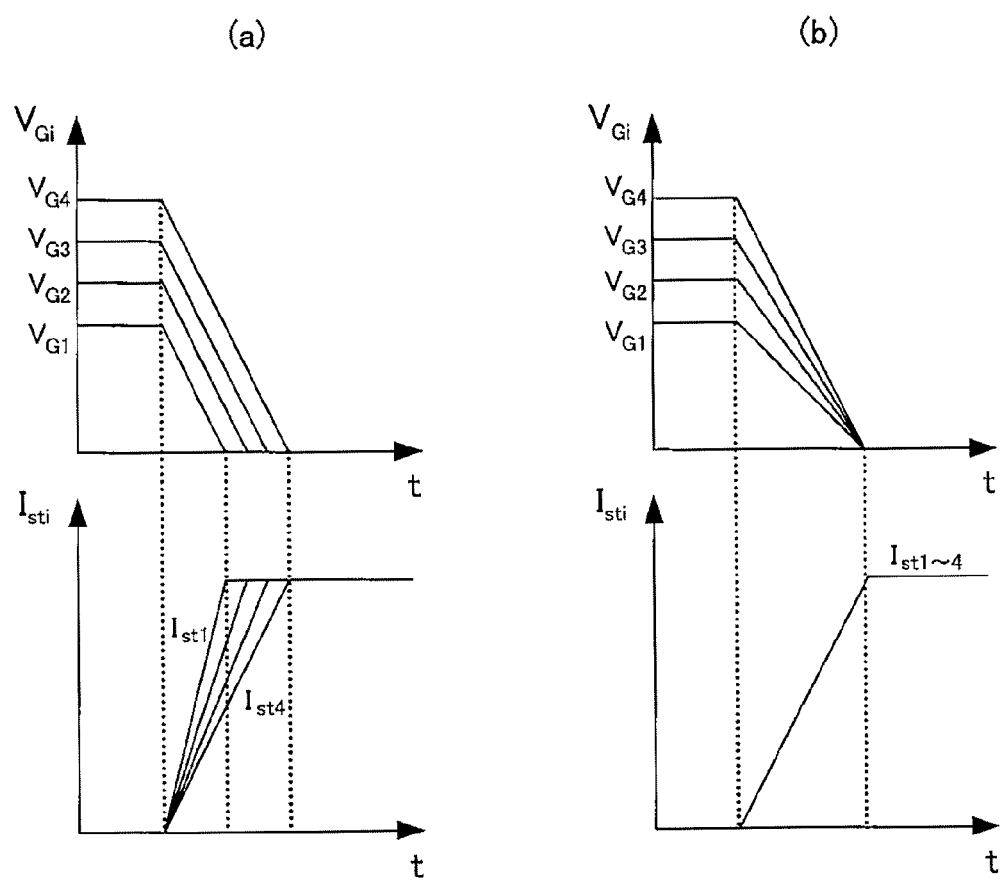
FIG. 5 is a diagram which shows an operation principle when the memory cell group 4 is configured to have the four-layered memory cell 3.

FIG. 5 is a diagram which shows an operation principle when the memory cell group 4 is configured to have the four-layered memory cell 3. FIG. 5(a) shows a fall of the gate potential VG and a rise of a storage element current 1st when the capacitor 7 is not provided. FIG. 5(b) shows a fall of the gate voltage VC and a rise of the storage element current 1st when the capacitor 7 is provided.

When the gate potential VG is lowered, the gate potential VG falls with a slope which is determined by input parasitic capacitance of a gate terminal, and parasitic capacitance, wiring capacitance, and the like of the selection gate driver 5. As described in Embodiment 1, since the semiconductor memory device according to the invention supplies a different gate potential VG to each layer, when each gate potential VG falls with the same slope, each gate potential VG has a different fall time, respectively, as shown in FIG. 5(a). That is, a current $I_{st1}$ controlled by the lowest gate potential $V_{G1}$ rises fastest, and a current $I_{st4}$ controlled by the highest gate potential $V_{G4}$ rises slowest.

Since the phase-change material is changed in state according to a time to supply a current, and stores information, when each memory cell has a different rise time of a current, and each layer is controlled in the same manner, a state of the storage element varies for each memory cell, and a bit error is more likely to occur.

In Embodiment 3, a rise time of a current flowing in each memory cell is aligned by providing the capacitor 7 and delaying a gate potential which falls fast. Specifically, a capacity of the capacitor 7 corresponding to the gate potential $V_{G1}$ which falls the fastest is set to be the largest, the capacity is gradually decreased upward, and the capacity of the capacitor 7 corresponding to the gate potential $V_{G4}$ is set to be the smallest. Accordingly, as shown in FIG. 5(b), a gate potential VG of each layer falls at the same delay time, and thus current flowing in the storage element rises at the same delay time.

Embodiment 3

Summary

As described above, the semiconductor memory device according to Embodiment 3 provides a delay circuit which delays a fall of a gate potential in each layer, and thereby it is possible to align a rise time of a current supplied to the storage element in each layer. Accordingly, it is possible to suppress a state of the storage element so as not to vary due to a different current supplied to each memory cell.

If the rise of the current flowing in the storage element can be aligned by delaying the fall of the gate potential VG, it is possible to adopt a circuit configuration other than the circuit configuration shown in FIG. 4. For example, it is considered to use an inductance instead of the capacitor 7. Additionally, a timing of a control signal to be input to the selection gate driver 5 may be delayed on a control circuit side without changing a falling gradient of the gate potential. In an example shown in FIG. 5, a start timing of lowering the gate potential $V_{G1}$ may be set to be the latest, and a start timing of lowering the gate potential $V_{G4}$ may be set to be the earliest.

A position in which the capacitor 7 or the inductance is provided is not particularly limited; however, it is considered as the simplest implementation to provide the capacitor 7 or the inductance on a circuit substrate which implements the voltage converter 6 or the selection gate driver 5.

Embodiment 4

Figure 6:
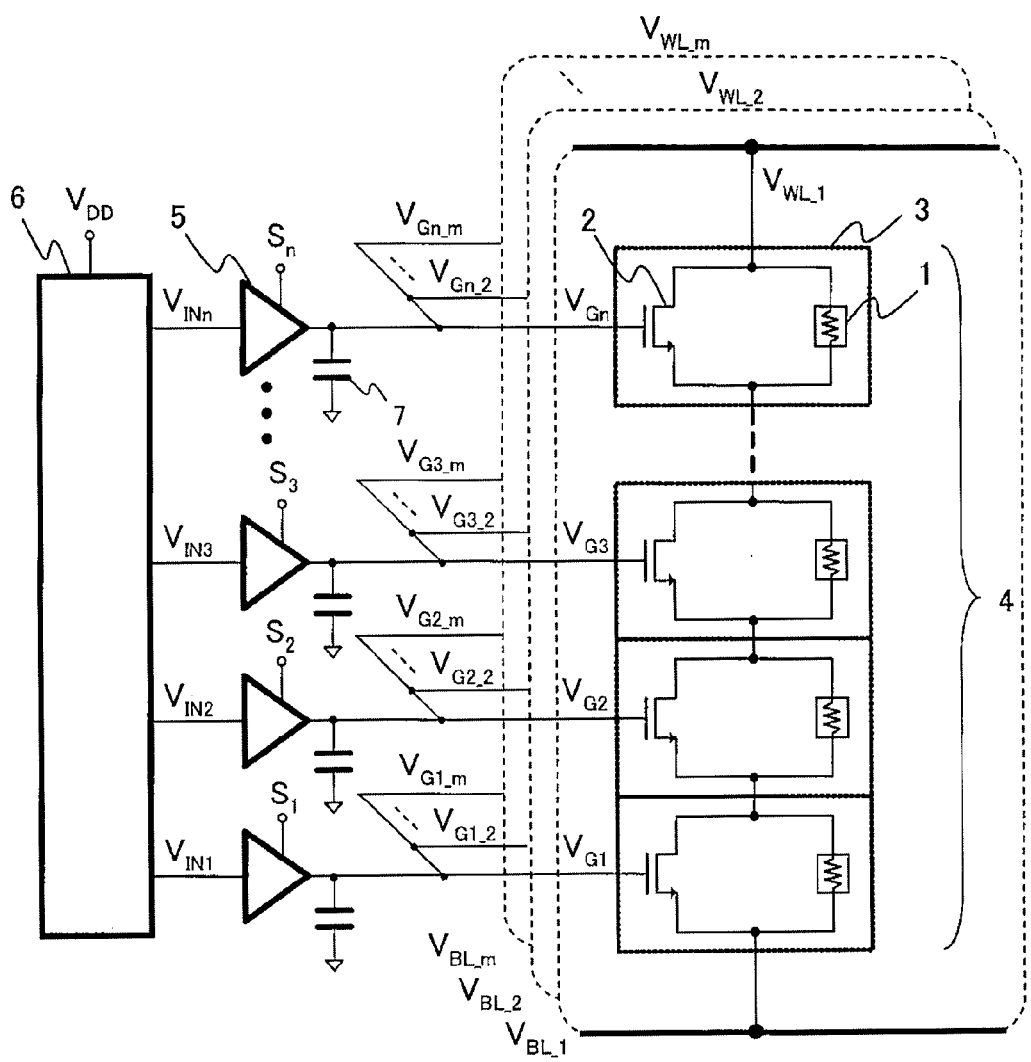
FIG. 6 is a diagram which shows a memory circuit configuration of a semiconductor memory device according to Embodiment 4.

FIG. 6 is a diagram which shows a memory circuit configuration of a semiconductor memory device according to Embodiment 4 of the invention. In Embodiment 4, in the circuit configuration described in Embodiment 2, the capacitor 7 described in Embodiment 3 is disposed in each layer. Accordingly, it is possible to align a fall time of a gate potential for each layer while suppressing a circuit area by commonizing the voltage converter 6 and the selection gate driver 5.

In particular, since parasitic capacitance of a signal line and the like is increased and a variation in a delay time of each layer is increased when the selection gate driver 5 is commonized for the plurality of memory cell groups 4, a problem described in Embodiment 3 of FIG. 5 is easily actualized. Therefore, effects of Embodiment 2 can be achieved by introducing a delay circuit (or a circuit configuration which exhibits the same effects) by the capacitor 7 described in Embodiment 3.

Embodiment 5

Figure 7:
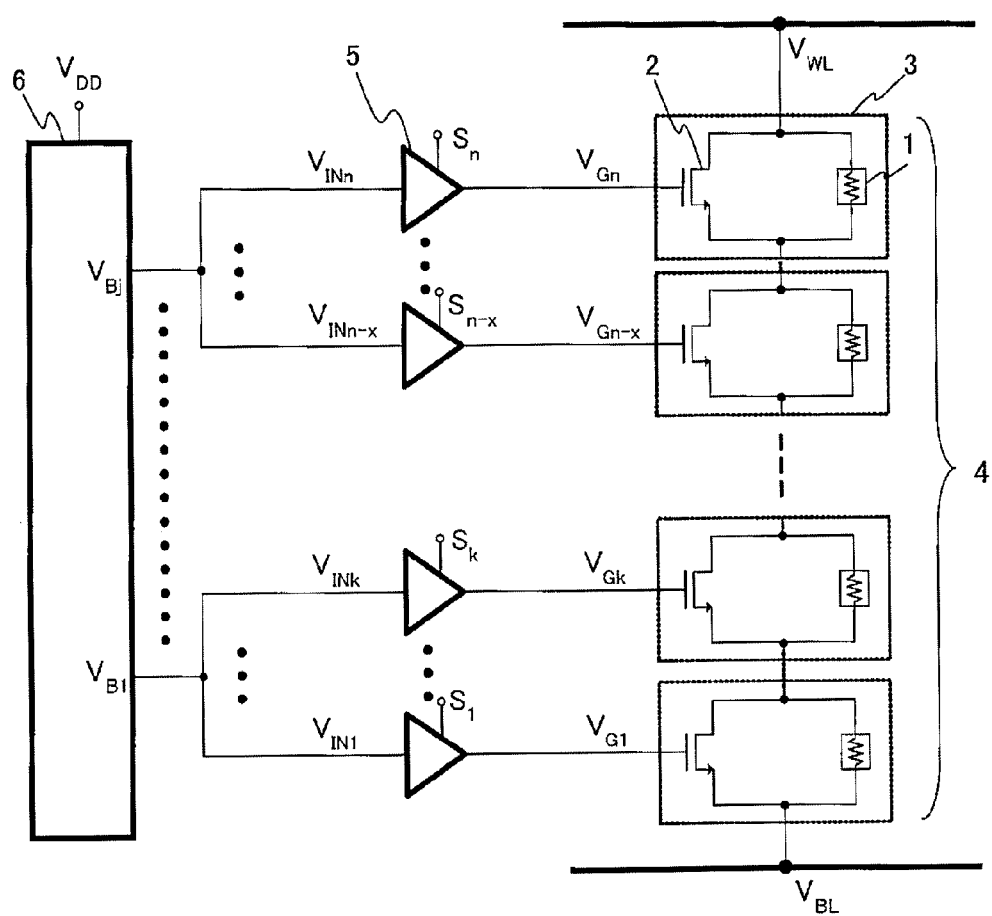
FIG. 7 is a diagram which shows a memory circuit configuration of a semiconductor memory device according to Embodiment 5.

FIG. 7 is a diagram which shows a memory circuit configuration of a semiconductor memory device according to Embodiment 5 of the invention. In Embodiment 5, a plurality of adjacent memory cells 3 in the memory cell group 4 are assumed as a set, and a common gate voltage is supplied thereto. In an example shown in FIG. 7, input voltages $V_{IN1}$ to $V_{INk}$ supplied to the selection gate driver 5 share a voltage output from an output terminal $V_{B1}$, and gate voltages $V_{G1}$ to $V_{Gk}$ corresponding to these input voltages are common. In a similar manner, the input voltages $V_{INn-x}$ to $V_{INn}$ commonize a voltage output from an output terminal $V_{Bj}$ and gate voltages $V_{Gn-x}$ to $V_{Gn}$ corresponding to these input voltages are common. The number of memory cells using the same gate potential or the number of sets may be arbitrary.

Since the memory cell 3 using the same gate potential has a different gate-source voltage for each layer as described in Embodiment 1, a current flowing in the storage element varies in each layer. However, in a range which can tolerate the variation, it is considered that trouble does not occur even if the same gate potential is used as shown in FIG. 7. Therefore, it is possible to reduce the circuit occupying area and the power consumption of the voltage converter 6 by reducing the number of output terminals of the voltage converter 6.

Embodiment 6

Figure 8:
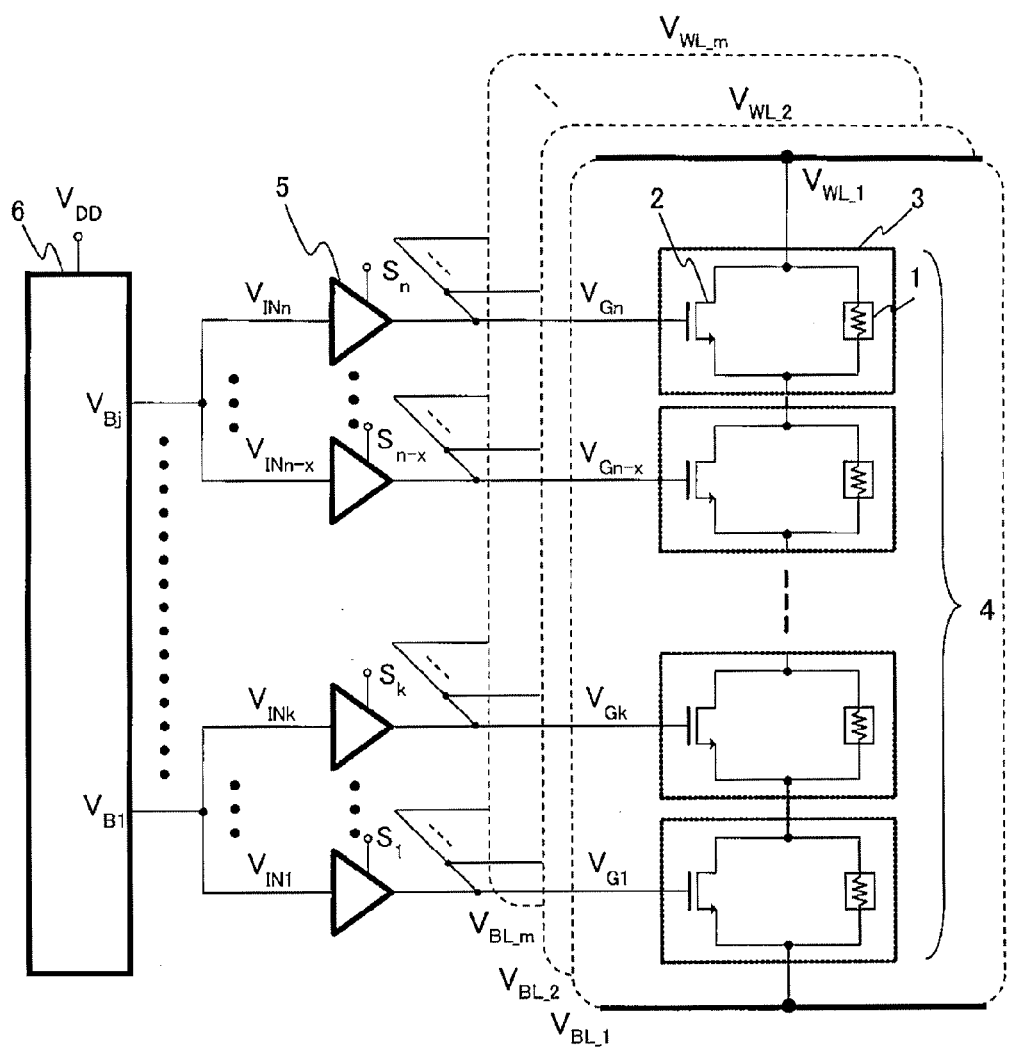
FIG. 8 is a diagram which shows a memory circuit configuration of a semiconductor memory device according to Embodiment 6.

FIG. 8 is a diagram which shows a memory circuit configuration of a semiconductor memory device according to Embodiment 6 of the invention. In Embodiment 6, under the circuit configuration described in Embodiment 2, in the same manner as in Embodiment 5, a plurality of adjacent memory cells 3 in the memory cell group 4 are made to be a set and a common gate voltage is supplied thereto. Accordingly, in the same manner as in Embodiment 2, it is possible to reduce the circuit occupying area and the power consumption of the voltage converter 6 by further reducing the number of output terminals of the voltage converter 6, while suppressing the circuit occupying area and the power consumption of the voltage converter 6 and the selection gate driver 5 to be small.

Embodiment 7

In Embodiment 7 of the invention, a circuit example of the voltage converter 6 will be described. The other configurations are the same as in Embodiments 1 to 6.

Figure 9:
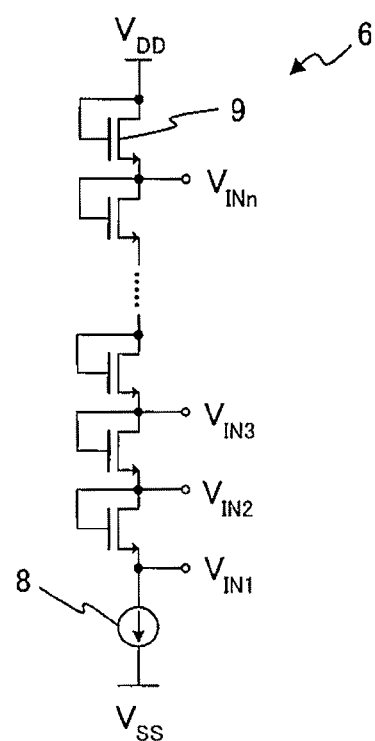
FIG. 9 is a diagram which shows a circuit example of a voltage converter 6.

FIG. 9 is a diagram which shows a circuit example of the voltage converter 6. The voltage converter 6 shown in FIG. 9 includes a plurality of transistors 9 and a current source 8. Each transistor 9 configures a diode connection which connects each gate terminal and each drain terminal with each other, and a constant voltage is generated between a drain and a source according to a current generated by the current source 8. By taking out a source voltage $V_{IN}$ of each transistor 9 to an output terminal, it is possible to output a plurality of voltages having a potential difference with a substantially constant interval. A circuit example shown in FIG. 9 has an advantage of having a smaller occupying area than in a method of generating a potential difference using resistance. In addition, the current source 8 can be realized by a general circuit used in a semiconductor integrated circuit.

Figure 10:
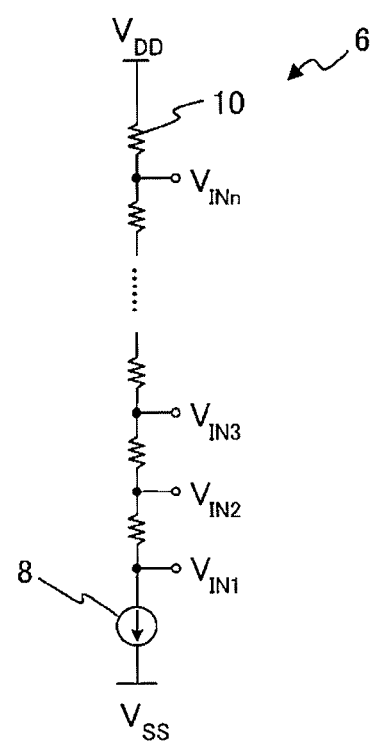
FIG. 10 is a diagram which shows another circuit example of the voltage converter 6.

FIG. 10 is a diagram which shows another circuit example of the voltage converter 6. The voltage converter 6 shown in FIG. 10 includes a plurality of resistances 10 and a current source 8. A constant voltage is generated at both ends of each resistance 10 according to a current generated by the current source 8. By taking out the voltage at both ends of each resistance 10 to an output terminal, it is possible to obtain a plurality of different voltages. By using the resistance 10, it is possible to freely design an output voltage compared to the circuit shown in FIG. 9, such that variation is easily reduced.

Embodiment 8

In Embodiment 8 of the invention, a circuit example of the selection gate driver 5 will be described. The other configurations are the same as in Embodiments 1 to 7.

Figure 11:
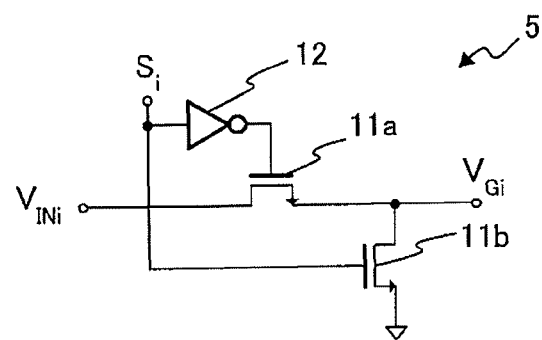
FIG. 11 is a diagram which shows a circuit example of a selection gate driver 5.

FIG. 11 is a diagram which shows a circuit example of a selection gate driver 5. The selection gate driver 5 shown in FIG. 11 includes N-channel Metal Oxide Semiconductor (NMOS) transistors 11a and 11b, and an inverter 12. The inverter 12 inverts a control voltage and inputs the inverted control voltage to a gate terminal of the NMOS transistor 11a. A control voltage is input to a gate terminal of the NMOS transistor 11b. When the control voltage has a high potential which represents a memory cell selection, the NMOD transistor 11a is non-conductive, the NMOS transistor 11b is conductive, and an output voltage is a ground voltage. When the control voltage has a low potential which represents a memory cell non-selection, the NMOS transistor 11a is conductive, the NMOS transistor 11b is non-conductive, and the output voltage is the same as the input voltage. By this operation, it is possible to realize the selection gate driver 5 with a small number of elements.

Figure 12:
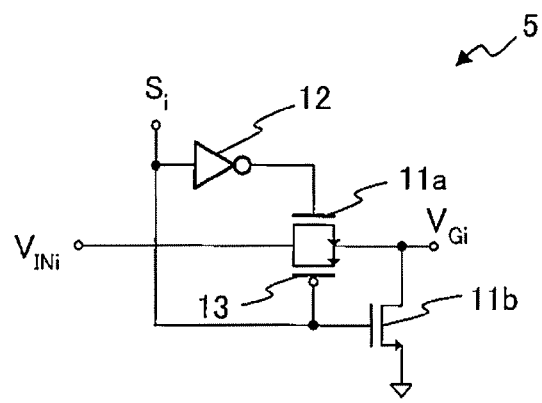
FIG. 12 is a diagram which shows another circuit example of the selection gate driver 5.

FIG. 12 is a diagram which shows another circuit example of the selection gate driver 5. The selection gate driver 5 shown in FIG. 12 includes the NMOS transistors 11a and 11b, the inverter 12, and a PMOS transistor 13. The inverter 12 inverts a control voltage and inputs the inverted control voltage to a gate terminal of the NMOS transistor 11a. A control voltage is input to a gate terminal of the PMOS transistor 13 and a gate terminal of the NMOS transistor 11b. When the control voltage has a high potential that represents a memory cell selection, the NMOS transistor 11a and the PMOS transistor become non-conductive, the NMOS transistor becomes conductive, and an output voltage becomes a ground voltage. When the control voltage has a low potential that represents a memory cell non-selection, the NMOS transistor 11a and the PMOS transistor 13 become conductive, the NMOS transistor 11b becomes non-conductive, and an output voltage becomes the same as an input voltage. Since the NMOS transistor 11a is conductive at an input voltage lower than a threshold voltage by newly connecting the PMOS transistor 13, it is possible to provide an output voltage of a wider range than a circuit shown in FIG. 11.

Embodiment 9

Characteristics of the memory cell 3 vary with an influence of an ambient temperature. In particular, a gate-source voltage necessary for making the selection transistor 2 conductive varies with temperature, and affects a current flowing in the storage element 1. In Embodiment 9 of the invention, a configuration example in which the current flowing in the storage element 1 is suppressed so as not to vary with temperature by adjusting the gate potential VG according to the temperature of the selection transistor 2 included in the memory cell 3 will be described. The other configurations are the same as in Embodiments 1 to 6 and 8.

Figure 13:
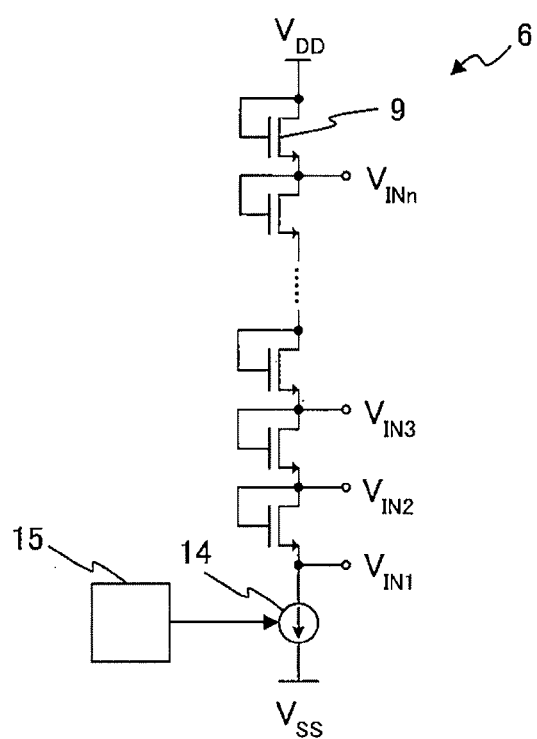
FIG. 13 is a diagram which shows a circuit example of the voltage converter 6 in Embodiment 9.

FIG. 13 is a diagram which shows a circuit example of the voltage converter 6 in Embodiment 9. In Embodiment 9, a current source 14 which can control an output voltage instead of the current source 8 is provided. A temperature sensing circuit 15 is connected to a control terminal of the current source 14. The temperature sensing circuit 15 and the current source 8 can use the same circuit configuration as a band gap reference (BGR) which is generally known in a semiconductor integrated circuit. For example, it is possible to use a band gap reference circuit as the temperature sensing circuit 15, and to use a current mirror circuit connected to the band gap reference circuit as a current source 14.

According to a circuit configuration shown in FIG. 13, it is possible to adjust the voltage VIN output from the voltage converter 6 by sensing an ambient temperature of the selection transistor 2 using the temperature sensing circuit 15, and adjusting an output voltage of the current source 14 according to the temperature. Accordingly, it is possible to adjust the current flowing in the storage element 1 and to supply a constant element current regardless of temperature in accordance with the gate-source voltage necessary for making the selection transistor 2 conductive.

Figure 14:
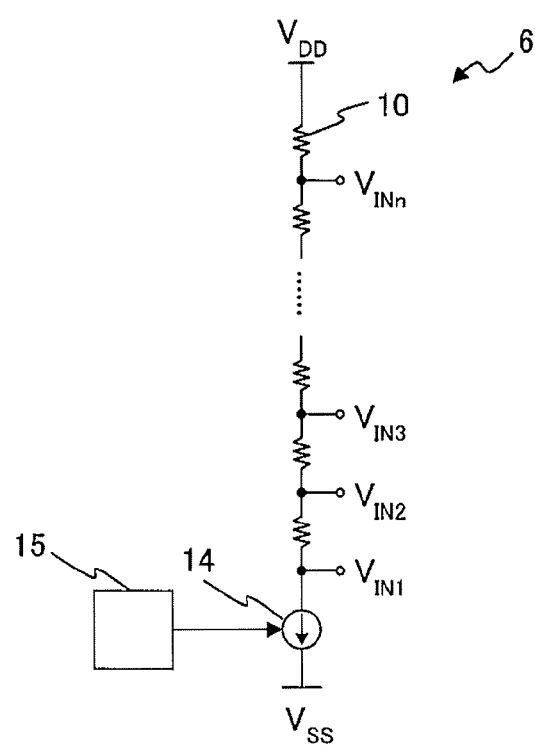
FIG. 14 is a diagram which shows another circuit example of the voltage converter 6 in Embodiment 9.

FIG. 14 is a diagram which shows another circuit example of the voltage converter 6 in Embodiment 9. The voltage converter 6 shown in FIG. 14 replaces the current source 8 in a circuit configuration described in FIG. 10 with the current source 14, and connects the temperature sensing circuit 15 to a control terminal of the current source 14. According to a circuit configuration shown in FIG. 14, since resistance with smaller temperature dependency compared to the diode-connected transistor shown in FIG. 13 is used, it is possible to further suppress a variation due to temperature.

Embodiment 10

In Embodiment 10 of the invention, a specific stack structure around a memory cell 3 of the semiconductor memory device according to the invention will be described. Here, a configuration in which a word line is formed in a plate shape to be shared among the memory cell group 4, and one of the memory cell group 4 is selected by a bit line and a selection transistor Sttr. is exemplified.

Figure 15:
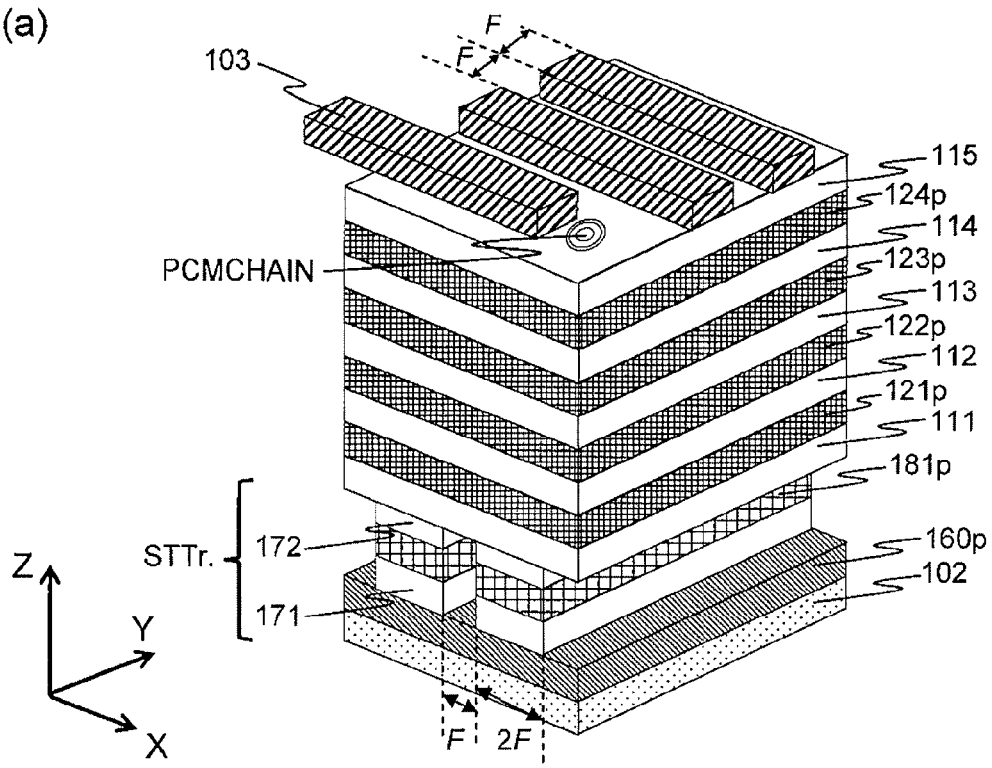
FIG. 15 is a diagram which shows a configuration of a memory cell array portion of the semiconductor memory device.
Figure 15:
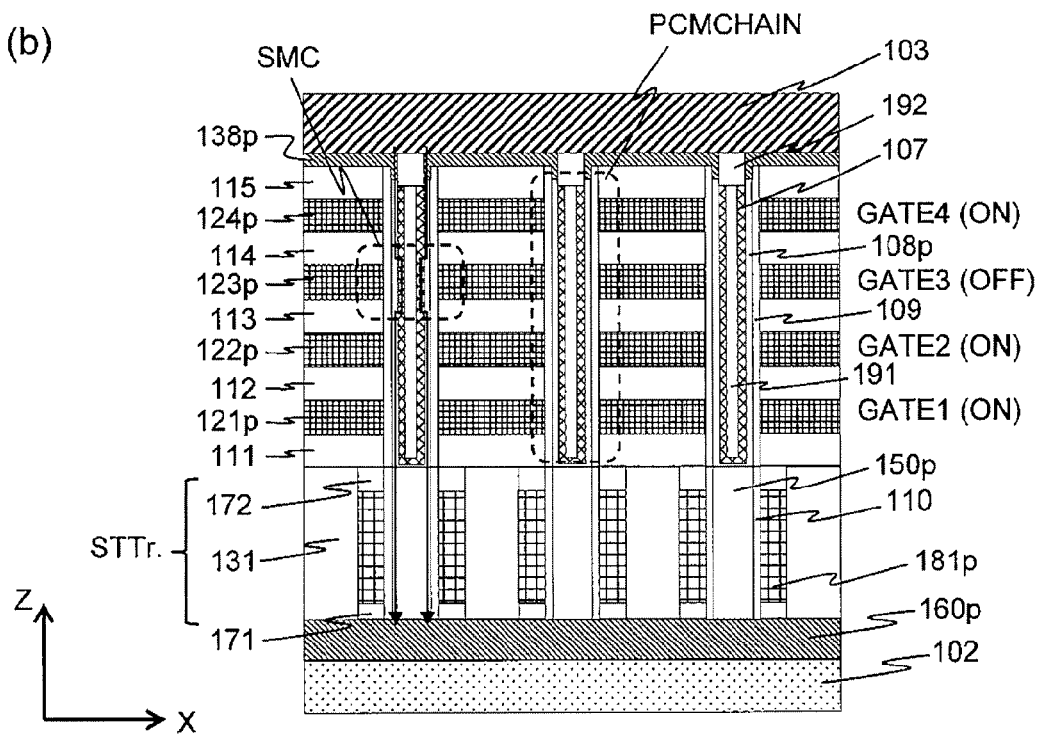

FIG. 15 is a diagram which shows a configuration of a memory cell array portion of the semiconductor memory device according to the invention. FIG. 15(*a*) is a three-dimensional schematic view of a portion of the semiconductor memory device, and FIG. 15(*b*) is an XZ cross-sectional view of FIG. 15(*a*).

An electrode 103 operates as a bit line (selection electrode) which extends in the X direction and selects a phase-change memory chain PCMCHAIN including the memory cell group 4 in the Y direction. Below the electrode 103, a stack body obtained by alternately stacking gate polysilicon layers 121*p*, 122*p*, 123*p*, and 124*p* which are gate electrodes of the selection transistor 2 and insulation layers 111, 112, 113, 114, and 115 is disposed. The phase-change memory chain PCMCHAIN is formed in a Z direction hole formed in the stack body. A selection transistor STTr includes a gate electrode 181*p*, a gate insulation film 110, and a channel semiconductor layer 150*p*. In a periphery of the selection transistor STTr, insulation layers 171, 172, and 131 are disposed. An electrode 102 in a plate shape is disposed at a bottom of the selection transistor STTr. An N-type semiconductor layer 138*p* electrically connects an electrode 103 and the PCMCHAIN. The insulation film 192 is formed between the electrode 103 and the PCMCHAIN. An N-type semiconductor layer 160*p* electrically connects an electrode 102 and a channel semiconductor layer 150*p*. The PCMCHAIN formed in the hole of the stack body includes a gate insulation film 109, a channel semiconductor layer 108*p*, a phase-change material layer 107, and an insulation film 191.

In FIG. 15, a bit line 103 extending in the X direction and a gate electrode 181*p* of the selection transistor Sttr. extending in the Y direction, by setting a minimum process size as F, can be formed at a 2F pitch and a 3F pitch, respectively. That is, it is possible to form a memory cell of a projected area $6F^2$ in an XY plane.

As the phase-change material layer 107, for example, a material which stores information using a resistance value in an amorphous state which is different from a resistance value in a crystalline state, such as a $Ge_2Sb_2Te_5$ can be used. A change operation from an amorphous state which is a state of high resistance to a crystalline state which is a state of low resistance, that is, a set operation, is performed by heating a phase-change material in the amorphous state up to a crystallization temperature or higher, and holding this for about $10^{-6}$ seconds or more to make the phase-change material in a crystalline state. The phase-change material in the crystalline state can be in the amorphous state by being heated up to a temperature of a melting point or higher to be a liquid state, and then by being rapidly cooled.

In a structure example shown in FIG. 15, the four-layered memory cell 3 is formed. The phase-change memory cell SMC surrounded by a dotted line in FIG. 15(*b*) corresponds to the memory cell 3. The storage element 1 is formed by the phase-change material layer 107 of each layer. The selection transistor 2 is formed by a channel semiconductor layer 108p formed on a side surface of a through hole and gate polysilicon layers 121p to 124p.

The invention is not limited to the embodiments described above, and various modifications are included. The embodiments are described in detail for easy understanding of the invention, but are not necessarily limited to include all described configurations. In addition, it is possible to replace a portion of the configuration of one embodiment with a configuration of another embodiment. Moreover, it is also possible to add the configuration of one embodiment to the configuration of another embodiment. Furthermore, with respect to a portion of a configuration of each embodiment, it is possible to add, delete, or replace another configuration.

REFERENCE SIGNS LIST 1 storage element
2 selection transistor
3 memory cell
4 memory cell group
5 selection gate driver
6 voltage converter
7 capacitor
8 current source
9 transistor
10 resistance
11a to 11b NMOS transistor
12 inverter
13 PMOS transistor
14 current source
15 temperature sensing circuit

The invention claimed is:

1. A semiconductor memory device comprising:
first and second signal lines;
a memory cell which is configured by connecting a transistor and a resistance change element in parallel, and stores information by a state change of the resistance change element; and
a driver circuit which supplies a gate voltage to the transistor,
wherein a plurality of the memory cells are connected in series between the first and second signal lines, and
wherein the driver circuit supplies a different gate voltage to at least two of the transistors included in each of the memory cells, respectively, and
wherein the driver circuit, among the gate voltages supplied to the transistors included in each of the memory cells, supplies a lowest gate voltage to the transistor included in the memory cell that is disposed at a position closest to the first signal line, gradually increases a gate voltage to be supplied to the transistor as a position at which the transistor is disposed gets closer to the second signal line, and supplies a highest gate voltage to the transistor included in the memory cell that is disposed at a position closest to the second signal line.

2. The semiconductor memory device according to claim 1, wherein the driver circuit lowers a gate voltage at the same fall time for the transistors included in all of the memory cells.

3. The semiconductor memory device according to claim 2, wherein the driver circuit, among the gate voltages supplied to the transistors included in each of the memory cells, most slowly lowers the gate voltage to be supplied to the transistor included in the memory cell that is disposed at a position closest to the first signal line, gradually increases a gradient of lowering the gate voltage to be supplied to the transistor as a position at which the transistor is disposed gets closer to the second signal line, and most rapidly lowers the gate voltage to be supplied to the transistor included in the memory cell that is disposed at a position closest to the second signal line.

4. The semiconductor memory device according to claim 2, wherein the driver circuit includes a delay circuit which delays the gate voltage between at least two of the transistors included by each of the memory cells, and
the delay circuit is configured so that gate voltages to be supplied to each of the transistors by the driver circuit all have the same fall time.

5. The semiconductor memory device according to claim 4, wherein the delay circuit is configured so that, among the gate voltages supplied to the transistors included in each of the memory cells, the gate voltage supplied to the transistor included in the memory cell that is disposed at a position closest to the first signal line falls most slowly, a gradient at which the gate voltage supplied to the transistor falls is gradually increased as a position at which the transistor is disposed gets closer to the second signal line, and the gate voltage supplied to the transistor included in the memory cell that is disposed at a position closest to the second signal line falls most rapidly.

6. The semiconductor memory device according to claim 5, wherein the delay circuit is configured using capacitors each disposed between at least two of the transistors included in each of the memory cells, and
each of the capacitors is configured so that a capacitor disposed between the transistors included in the memory cell disposed at a position closest to the first signal line has the largest capacity, a capacity of the capacitor disposed between the transistors is gradually decreased as a position at which the transistor is disposed gets closer to the second signal line, and a capacitor disposed between the transistors included in the memory cell disposed at a position closest to the second signal line has the smallest capacity.

7. The semiconductor memory device according to claim 2, wherein the driver circuit, among the gate voltages supplied to the transistors included in each of the memory cells, lowers the gate voltage to be supplied to the transistor included in the memory cell disposed at a position closest to the first signal line latest, sets a start timing of lowering the gate voltage supplied to the transistor to be faster as the position at which the transistor is disposed gets closer to the second signal line, and lowers the gate voltage supplied to the transistor included in the memory cell disposed at a position closest to the second signal line earliest.

8. The semiconductor memory device according to claim 1, further comprising:
a plurality of memory cell groups having the plurality of memory cells connected in series,
wherein the driver circuit is connected so as to supply the common gate voltage to memory cells disposed on the same stage after being counted from the first signal line or the second signal line among the memory cells included in each of the memory cell groups.

9. The semiconductor memory device according to claim 1, wherein the memory cell is configured by forming a resistance change material layer and a channel layer on a side surface of a through hole penetrating a stack body obtained by stacking gate electrode layers.

10. A semiconductor memory device comprising:
first and second signal lines;

a memory cell which is configured by connecting a transistor and a resistance change element in parallel, and stores information by a state change of the resistance change element;
a driver circuit which supplies a gate voltage to the transistor; and
a temperature sensing circuit which senses a temperature of the transistor,
wherein a plurality of the memory cells are connected in series between the first and second signal lines,
wherein the driver circuit supplies a different gate voltage to at least two of the transistors included in each of the memory cells, respectively, and
wherein the driver circuit adjusts the gate voltage according to a temperature of the transistor sensed by the temperature sensing circuit, thereby supplying a constant gate voltage to the transistor regardless of the temperature of the transistor.

11. The semiconductor memory device according to claim 10,
wherein the driver circuit, among the gate voltages supplied to the transistors included in each of the memory cells, supplies a lowest gate voltage to the transistor included in the memory cell that is disposed at a position closest to the first signal line, gradually increases a gate voltage to be supplied to the transistor as a position at which the transistor is disposed gets closer to the second signal line, and supplies a highest gate voltage to the transistor included in the memory cell that is disposed at a position closest to the second signal line.

12. The semiconductor memory device according to claim 10,
wherein the driver circuit lowers a gate voltage at the same fall time for the transistors included in all of the memory cells.

13. The semiconductor memory device according to claim 12,
wherein the driver circuit, among the gate voltages supplied to the transistors included in each of the memory cells, most slowly lowers the gate voltage to be supplied to the transistor included in the memory cell that is disposed at a position closest to the first signal line, gradually increases a gradient of lowering the gate voltage to be supplied to the transistor as a position at which the transistor is disposed gets closer to the second signal line, and most rapidly lowers the gate voltage to be supplied to the transistor included in the memory cell that is disposed at a position closest to the second signal line.

14. The semiconductor memory device according to claim 12,
wherein the driver circuit includes a delay circuit which delays the gate voltage between at least two of the transistors included by each of the memory cells, and
the delay circuit is configured so that gate voltages to be supplied to each of the transistors by the driver circuit all have the same fall time.

15. The semiconductor memory device according to claim 14,
wherein the delay circuit is configured so that, among the gate voltages supplied to the transistors included in each of the memory cells, the gate voltage supplied to the transistor included in the memory cell that is disposed at a position closest to the first signal line falls most slowly, a gradient at which the gate voltage supplied to the transistor falls is gradually increased as a position at which the transistor is disposed gets closer to the second signal line, and the gate voltage supplied to the transistor included in the memory cell that is disposed at a position closest to the second signal line falls most rapidly.

16. The semiconductor memory device according to claim 15,
wherein the delay circuit is configured using capacitors each disposed between at least two of the transistors included in each of the memory cells, and
each of the capacitors is configured so that a capacitor disposed between the transistors included in the memory cell disposed at a position closest to the first signal line has the largest capacity, a capacity of the capacitor disposed between the transistors is gradually decreased as a position at which the transistor is disposed gets closer to the second signal line, and a capacitor disposed between the transistors included in the memory cell disposed at a position closest to the second signal line has the smallest capacity.

17. The semiconductor memory device according to claim 12,
wherein the driver circuit, among the gate voltages supplied to the transistors included in each of the memory cells, lowers the gate voltage to be supplied to the transistor included in the memory cell disposed at a position closest to the first signal line latest, sets a start timing of lowering the gate voltage supplied to the transistor to be faster as the position at which the transistor is disposed gets closer to the second signal line, and lowers the gate voltage supplied to the transistor included in the memory cell disposed at a position closest to the second signal line earliest.

18. The semiconductor memory device according to claim 10, further comprising:
a plurality of memory cell groups having the plurality of memory cells connected in series,
wherein the driver circuit is connected so as to supply the common gate voltage to memory cells disposed on the same stage after being counted from the first signal line or the second signal line among the memory cells included in each of the memory cell groups.

19. The semiconductor memory device according to claim 10,
wherein the memory cell is configured by forming a resistance change material layer and a channel layer on a side surface of a through hole penetrating a stack body obtained by stacking gate electrode layers.

* * * * *